US009799684B2

(12) United States Patent
Jung et al.

(10) Patent No.: US 9,799,684 B2
(45) Date of Patent: Oct. 24, 2017

(54) LIQUID CRYSTAL DISPLAY

(71) Applicant: Samsung Display Co., Ltd., Yongin-si (KR)

(72) Inventors: Jae Hoon Jung, Anyang-si (KR); Dan Bi Yang, Gunpo-si (KR); Min-Joo Han, Seoul (KR); Ji Phyo Hong, Pyeongtaek-si (KR); Heung Shik Park, Seoul (KR); Ki Chul Shin, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/858,020

(22) Filed: Sep. 18, 2015

(65) Prior Publication Data

US 2016/0299397 A1    Oct. 13, 2016

(30) Foreign Application Priority Data

Apr. 9, 2015  (KR) .......................... 10-2015-0050328

(51) Int. Cl.
*H01L 29/04* (2006.01)
*H01L 27/12* (2006.01)
(Continued)

(52) U.S. Cl.
CPC .... *H01L 27/1251* (2013.01); *G02F 1/136213* (2013.01); *H01L 27/124* (2013.01); *H01L 27/1222* (2013.01); *G02F 1/133788* (2013.01); *G02F 2001/134345* (2013.01); *H01L 21/12* (2013.01); *H01L 29/4908* (2013.01)

(58) Field of Classification Search
CPC .............. H01L 27/1285; H01L 27/12; H01L 29/66765; H01L 29/4908; H01L 29/66757; H01L 29/78621; H01L 29/04; H01L 29/78678; H01L 27/1214; H01L 27/3262; H01L 27/3272
USPC ..... 257/59, 72, 49, 57, 66, E27.111; 438/48, 438/128, 149, 151; 349/38, 42.43
See application file for complete search history.

(56) References Cited

U.S. PATENT DOCUMENTS 8,803,855 B2 * 8/2014 Goh ...................... G09G 3/3648
                                                   345/204
2006/0286703 A1 * 12/2006 Um ...................... G02F 1/13624
                                                    438/30

(Continued)

FOREIGN PATENT DOCUMENTS

KR    1020110117998    10/2011
KR    1020130119204    10/2013

OTHER PUBLICATIONS

Hitoshi Aoki, "Dynamic Characterization of a—Si TFT-LCD Pixels", IEEE Transactions on Electron Devices, vol. 43, No. 1, Jan. 1996, pp. 1-9.

*Primary Examiner* — Thinh T Nguyen
(74) *Attorney, Agent, or Firm* — Cantor Colburn LLP (57) ABSTRACT

A liquid crystal display includes a first substrate, a gate line and a data line disposed on the first substrate, a first thin film transistor and a second thin film transistor connected to the gate line and the data line, a first subpixel electrode connected to the first thin film transistor, a resistor connected to the second thin film transistor and a resistance of the resistor is changed by a pulsed gate-on signal applied to the gate line, and a second subpixel electrode connected to the resistor.

9 Claims, 7 Drawing Sheets

(51) Int. Cl.
    *G02F 1/1362* (2006.01)
    *H01L 21/12* (2006.01)
    *H01L 29/49* (2006.01)
    *G02F 1/1337* (2006.01)
    *G02F 1/1343* (2006.01)

(56) References Cited

U.S. PATENT DOCUMENTS

2011/0261028 A1* 10/2011 Goh .................... G09G 3/3648
                                                    345/204
2013/0077002 A1*  3/2013 Yoon ................ G02F 1/136213
                                                    349/38

* cited by examiner

LIQUID CRYSTAL DISPLAY

This application claims priority to Korean Patent Application No. 10-2015-0050328 filed on Apr. 9, 2015, and all the benefits accruing therefrom under 35 U.S.C. §119, the content of which in its entirety is herein incorporated by reference.

BACKGROUND (a) Field

Exemplary embodiments relate to a liquid crystal display.

(b) Description of the Related Art

Liquid crystal displays ("LCDs") are one of the most widely used flat panel displays. An LCD includes a pair of panels provided with field-generating electrodes, such as pixel electrodes and a common electrode, and a liquid crystal ("LC") layer interposed between the pair of panels. The LCD displays images by applying voltages to the field-generating electrodes to generate an electric field in the LC layer that determines orientations of LC molecules therein to adjust polarization of incident light thereto.

Among the various types of LCDs, a vertically aligned mode LCD, in which liquid crystal molecules are aligned so that their long axes are perpendicular to the upper and lower panels while no electric field is applied, has been in the limelight because its contrast ratio is high and a wide reference viewing angle is easily obtained.

In the case of the vertically aligned mode LCD, in order to make side visibility close to front visibility, a method of dividing one pixel into two subpixels and making transmittance different by applying a different voltage to each of the two subpixels, respectively, has been proposed.

SUMMARY

When a side visibility is close to a front visibility by dividing one pixel into two subpixels and making the transmittance different between the two subpixels, a plurality of transistors is provided to apply different voltages to the two subpixels and a plurality of contact holes is provided to connect the transistor and the subpixel. However, an aperture ratio of the LCD may be reduced due to the thin film transistors and the contact holes.

The invention has been made in an effort to provide a liquid crystal display ("LCD") that may prevent an aperture ratio of an LCD from being reduced due to thin film transistors and contact holes as well as make side visibility close to front visibility by dividing one pixel into two subpixels and making transmittances thereof different.

An embodiment provides an LCD, including a first substrate, a gate line and a data line disposed on the first substrate, a first thin film transistor and a second thin film transistor connected to the gate line and the data line, a first subpixel electrode connected to the first thin film transistor, a resistor connected to the second thin film transistor and resistance of the resistor is changed by a pulsed gate-on signal applied to the gate line, and a second subpixel electrode connected to the resistor.

In an exemplary embodiment, the resistor may include a resistance input terminal connected to an output terminal of the second thin film transistor, and a resistance output terminal connected to the second subpixel electrode.

In an exemplary embodiment, the LCD may further include a resistance semiconductor layer disposed below the resistance input terminal and the resistance output terminal.

In an exemplary embodiment, portions of edges of the resistance input terminal and the resistance output terminal may overlap at least part of edges of the resistance semiconductor layer.

In an exemplary embodiment, the resistance input terminal and the resistance output terminal may be spaced apart from each other.

In an exemplary embodiment, the gate signal may include a reference resistance electrode, and the reference resistance electrode may be disposed below the resistance semiconductor layer.

In an exemplary embodiment, an edge of the reference resistance electrode and an edge of the resistance semiconductor layer may overlap each other, and portions of edges of the resistance input terminal and the resistance output terminal may overlap at least part of edges of the reference resistance electrode and the resistance semiconductor layer.

In an exemplary embodiment, the reference resistance electrodes may be divided to be disposed at a lower portion of the resistance semiconductor layer overlapping the resistance input terminal, and to be disposed at a lower portion of the resistance semiconductor layer overlapping the resistance output terminal.

In an exemplary embodiment, the semiconductor layer may include hydrogenated amorphous silicon.

In an exemplary embodiment, a voltage of the gate-on signal may be greater than a data voltage applied to the data line.

In an exemplary embodiment, as the voltage of the gate-on signal increases, the resistance of the resistor may decrease.

According to the embodiment, it is possible to prevent an aperture ratio of an LCD from being reduced due to thin film transistors and contact holes, as well as to make side visibility close to front visibility by dividing one pixel into two subpixels and making transmittances thereof different.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1:
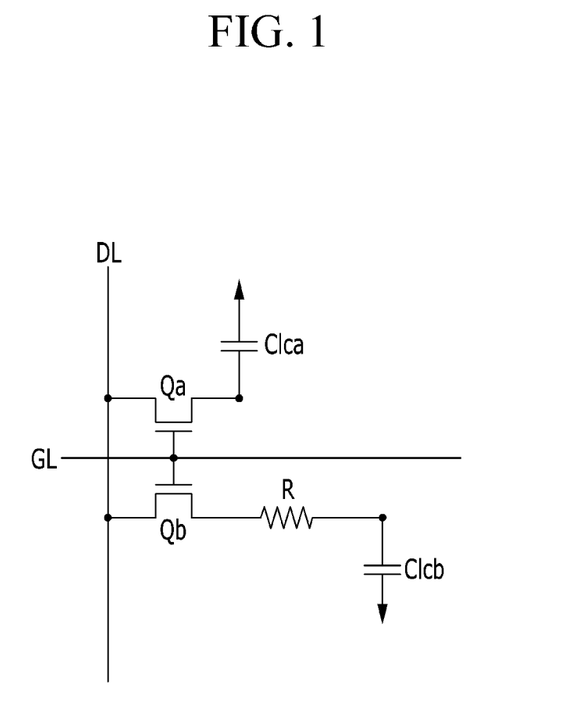
FIG. 1 is an equivalent circuit diagram of an exemplary embodiment of one pixel of a liquid crystal display ("LCD") according to the invention.

First, referring to FIG. 1, a signal line and disposition of pixels of a liquid crystal display ("LCD") and a driving method thereof according to an exemplary embodiment will be described. FIG. 1 is an equivalent circuit diagram of one pixel of an LCD according to an exemplary embodiment.

Referring to FIG. 1, one pixel PX of an LCD according to the exemplary embodiment includes a plurality of signal lines including a gate line GL transmitting a gate signal and a data line DL transmitting a data signal, a first switching element Qa and a second switching element Qb that are connected to the plurality of signal lines, and a first liquid crystal capacitor Clca and a second liquid crystal capacitor Clcb.

Each of the first switching element Qa and the second switching element Qb is connected to the gate line GL and the data line DL.

In an exemplary embodiment, the first switching element Qa and the second switching element Qb are three-terminal elements such as a thin film transistor ("TFT"), a control terminal thereof is connected to the gate line GL, an input terminal thereof is connected to the data line DL, an output terminal of the first switching element Qa is connected to the first liquid crystal capacitor Clca, and the output terminal of the second switching element Qb is connected to the second liquid crystal capacitor Clcb.

A resistor R is connected between the output terminal of the second switching element Qb and the second liquid crystal capacitor Clcb.

When a gate-on signal is applied to the gate line GL, the first switching element Qa and the second switching element Qb connected thereto are turned on. Accordingly, the data voltage applied to the data line DL is applied to the first liquid crystal capacitor Clca and the second liquid crystal capacitor Clcb through the first switching element Qa and the second switching element Qb that are turned on. In this case, the data voltage applied to the second switching element Qb decreases while passing through the resistor R before the data voltage is applied to the second liquid crystal capacitor Clcb.

Thus, the voltage charged in the second liquid crystal capacitor Clcb decreases by the resistance of the resistor R. Accordingly, a voltage charged to the first liquid crystal capacitor Clca is higher than a voltage charged to the second liquid crystal capacitor Clcb.

As such, the voltages charged to the first and second liquid crystal capacitors Clca and Clcb, respectively, become different from each other. Since the voltages of the first and second liquid crystal capacitors Clca and Clcb, respectively, become different from each other, the first and second subpixels include liquid crystal molecules having different tilt angles such that the first and second subpixels respectively have different luminances.

Accordingly, when the voltages of the first and second liquid crystal capacitors Clca and Clcb are appropriately adjusted, an image viewed from a side is substantially the same as an image viewed from the front, thereby improving side visibility.

Next, a detailed configuration of the LCD according to the exemplary embodiment shown in FIG. 1 will be described with reference to FIGS. 2 to 5.

Figure 2:
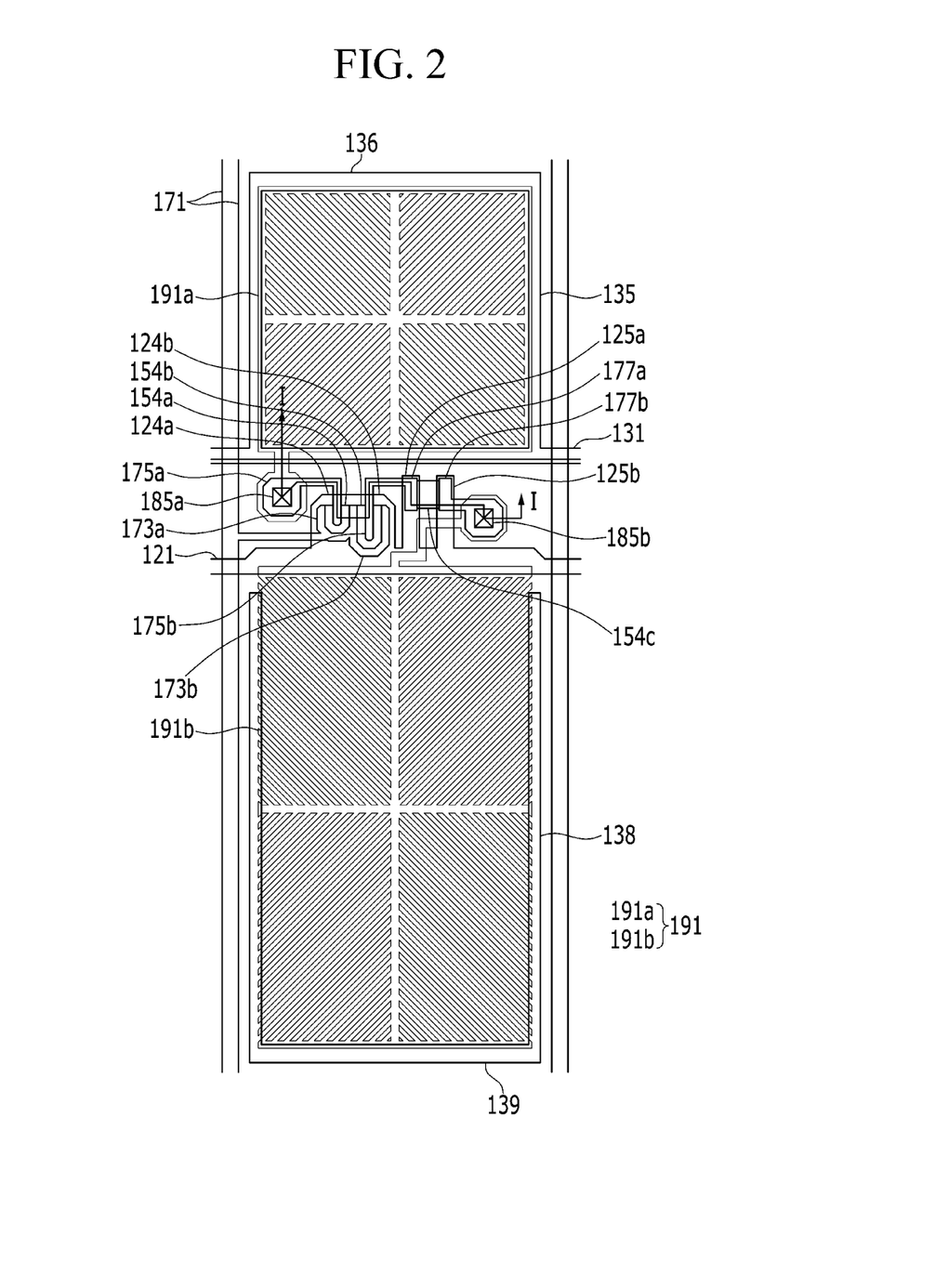
FIG. 2 is a plan view of an exemplary embodiment of an LCD according to the invention.
Figure 3:
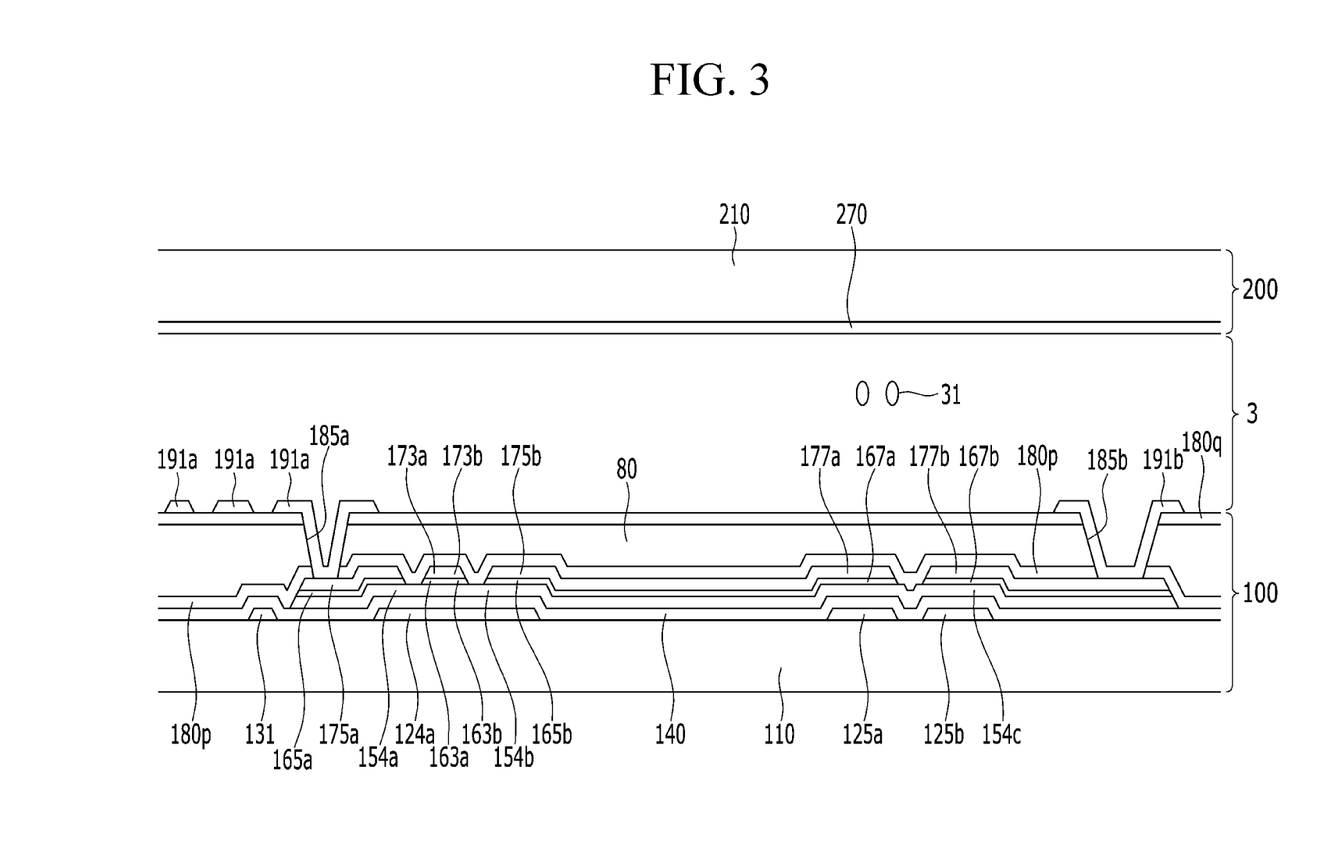
FIG. 3 is a cross-sectional view of the LCD of FIG. 2 taken along line I-I.
Figure 4A:
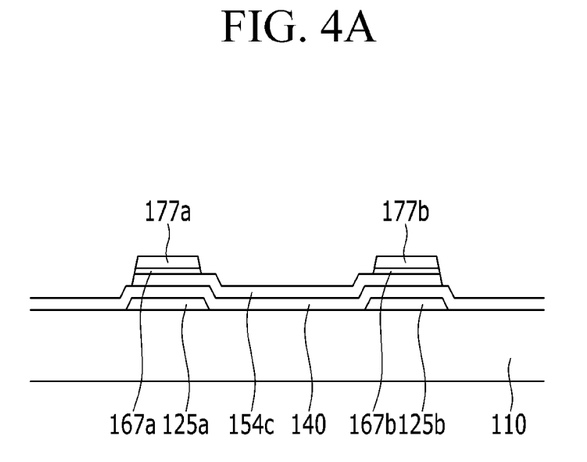
FIGS. 4A and 4B are drawings partially illustrating the LCD of FIG. 2.
Figure 4B:
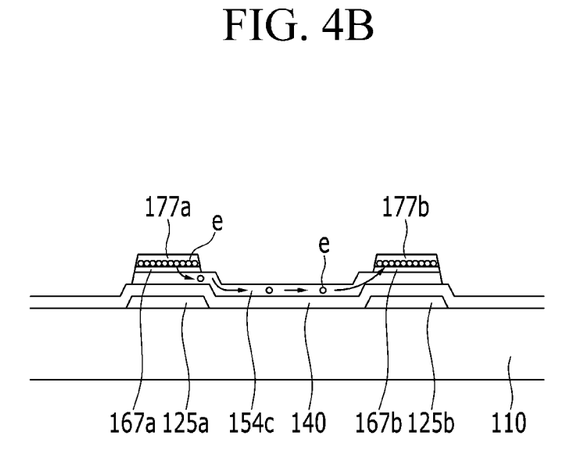
Figure 5:
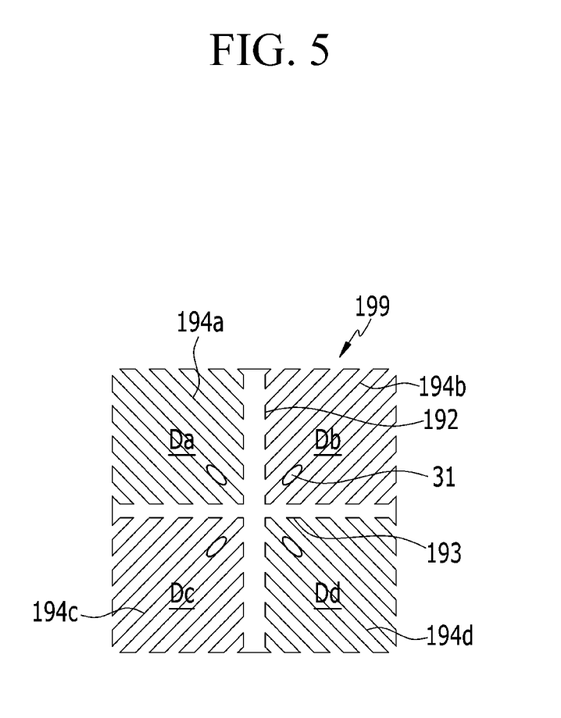
FIG. 5 is a top plan view of a basic area of a pixel electrode of the LCD of FIG. 2.

FIG. 2 is a plan view of an LCD according to an exemplary embodiment. FIG. 3 is a cross-sectional view of the LCD of FIG. 2 taken along line I-I. FIGS. 4A and 4B are drawings partially illustrating the LCD of FIG. 2. FIG. 5 is a top plan view of a basic area of a pixel electrode of the LCD of FIG. 2.

Referring to FIGS. 2 and 3, the LCD according to the exemplary embodiment includes lower and upper panels 100 and 200 facing each other, a liquid crystal layer 3 interposed between the two display panels 100 and 200, and a pair of polarizers (not shown) attached to outer surfaces of the display panels 100 and 200.

The lower panel 100 will be described first.

In an exemplary embodiment, a gate conductor including a gate line 121 and a storage voltage line 131 is disposed on a first insulation substrate 110 that includes transparent glass, plastic, or the like.

The gate line 121 includes a first gate electrode 124a, a second gate electrode 124b, a first reference resistance electrode 125a, and a second reference resistance electrode 125b.

The storage voltage line 131 includes first storage electrodes 135 and 136. Second storage electrodes 138 and 139 that are not connected to the storage voltage line 131 but are overlapped with a second subpixel electrode 191b are disposed in the lower panel. Although the exemplary embodiment in which the storage voltage line 131 is provided will be described hereinafter, the storage voltage line 131 may not be provided in some exemplary embodiments. In an exemplary embodiment, the first storage electrodes 135 and 136 and the second storage electrodes 138 and 139 may be disposed in the lower panel 100.

A gate insulating layer 140 is disposed on the gate line 121 and the storage voltage line 131.

A first semiconductor 154a, a second semiconductor 154b, and a third semiconductor 154c are disposed on the gate insulating layer 140.

A plurality of ohmic contacts 163a, 165a, 163b, 165b, 167a, and 167b are disposed on the semiconductors 154a, 154b, and 154c.

A data conductor including a data line 171, first and second source electrodes 173a and 173b, first and second drain electrodes 175a and 175b, a resistance inputting electrode 177a, and a resistance outputting electrode 177b is disposed on the ohmic contacts 163a, 165a, 163b, 165b, 167a, and 167b and the gate insulating layer 140.

The first source electrode 173a and the second source electrode 173b are extended from the data line 171.

The resistance inputting electrode 177a is connected to the second drain electrode 175b.

The data conductor, the semiconductor that is disposed below the data conductor, and the ohmic contacts may be simultaneously provided using one mask.

The first gate electrode 124a, the first source electrode 173a, and the first drain electrode 175a provide a first TFT Qa along with the first semiconductor layer 154a, and a channel of the first TFT is defined at the first semiconductor layer 154a between the first source electrode 173a and the first drain electrode 175a. Similarly, the second gate electrode 124b, the second source electrode 173b, and the second drain electrode 175b form a second TFT Qb along with the second semiconductor layer 154b, and a channel thereof is defined at the second semiconductor layer 154b between the second source electrode 173b and the second drain electrode 175b.

The reference resistance electrodes 125a and 125b are respectively disposed under the resistance inputting electrode 177a and the resistance outputting electrode 177b, and edges of the reference resistance electrodes 125a and 125b are respectively overlapped with edges of the resistance inputting electrode 177a and the resistance outputting electrode 177b.

A first passivation layer 180p is disposed on the data line 171, the first and second source electrodes 173a and 173b, the first and second drain electrodes 175a and 175b, the resistance inputting and outputting electrodes 177a and 177b, and the exposed portion of the semiconductors 154a, 154b, and 154c. In an exemplary embodiment, the first passivation layer 180p may include an inorganic insulating layer including a silicon nitride, a silicon oxide, or the like. The first passivation layer 180p may prevent a pigment of a color filter 80 disposed thereon from flowing into the exposed semiconductor layers 154a, 154b, and 154c.

The color filter 80 is disposed on the first passivation layer 180p. The color filter 80 is extended in a vertical direction along two adjacent data lines. Although not illustrated, a light blocking member may be disposed on the first display panel 100.

A second passivation layer 180q is disposed on the color filter 80.

In an exemplary embodiment, the second passivation layer 180q may include an inorganic insulating layer including a silicon nitride, a silicon oxide, or the like. The second passivation layer 180q prevents peeling of the color filter 80, and suppresses contamination of the liquid crystal layer 3 by an organic material such as a solvent flowing from the color filter 80 to prevent defects such as afterimages that may occur when a screen is driven.

A first contact hole 185a and a second contact hole 185b are defined in the first passivation layer 180p and the second passivation layer 180q to respectively expose the first drain electrode 175a and the second drain electrode 175b.

A plurality of pixel electrodes 191 is disposed on the second passivation layer 180q. The pixel electrodes 191 are separated from each other while interposing the gate line 121 therebetween, and each of the pixel electrodes 191 includes a first subpixel electrode 191a and a second subpixel electrode 191b adjacent in a column direction based on the gate line 121 in a plan view. In an exemplary embodiment, the pixel electrode 191 may include a transparent material such as indium tin oxide ("ITO") or indium zinc oxide ("IZO"). In an exemplary embodiment, the pixel electrode 191 may also include a reflective metal such as aluminum, silver, chromium, or an alloy thereof.

The first and second subpixel electrodes 191a and 191b respectively include one or more basic electrodes 199 illustrated in FIG. 5 or variations thereof.

The first and second subpixel electrodes 191a and 191b are physically and electrically connected to the first drain electrode 175a and the resistance outputting electrode 177b through the first and second contact holes 185a and 185b, and are applied with the data voltage from the first drain electrodes 175a and the resistance outputting electrode 177b, respectively.

As described above, the resistance inputting electrode 177a and the resistance outputting electrode 177b that consist of the resistor R are disposed between the second drain electrode 175b and the second subpixel electrode 191b. Accordingly, when a data voltage applied to the second drain electrode 175b is transmitted to the second subpixel electrode 191b, the data voltage decreases. Thus, the voltage applied to the first subpixel electrode 191a is greater than that applied to the second subpixel electrode 191b.

The first subpixel electrode 191a and the second subpixel electrode 191b to which the data voltage is applied generate an electric field together with a common electrode 270 of the upper display panel 200 to determine an orientation of the liquid crystal molecules of the liquid crystal layer 3 between the two electrodes 191 and 270. Luminance of light passing through the liquid crystal layer 3 is changed according to such determined orientation of the liquid crystal molecules.

A first alignment layer (not shown) may be disposed on the pixel electrode 191.

The upper panel 200 will now be described.

The common electrode 270 is disposed on a second substrate 210. A second alignment layer (not shown) is disposed on the common electrode 270.

The liquid crystal layer 3 has negative dielectric anisotropy, and liquid crystal molecules 31 of the liquid crystal layer 3 are aligned so that their long axes are perpendicular to the surfaces of the two display panels 100 and 200 while no electric field is present.

In an exemplary embodiment, at least one of the first alignment layer, the second alignment layer, and the liquid crystal layer may include photopolymers.

The resistor R of the LCD according to the exemplary embodiment will be described with reference to FIGS. 4A and 4B.

Referring to FIG. 4A, the first reference resistance electrode 125a and the second reference resistance electrode 125b are disposed on the first substrate 110, and the gate insulating layer 140 that includes a silicon nitride (SiNx), a silicon oxide (SiOx), or the like is disposed on the first reference resistance electrode 125a and the second reference resistance electrode 125b.

The third semiconductor 154c including amorphous silicon and the like is disposed on the gate insulating layer 140. The amorphous silicon is difficult to use as an active material of the TFT since it has a high defect density, e.g., about 1019 per cubic centimeter (/cm3), but is usable for a semiconductor of the switching element since its defect density, e.g., about 1015/cm3, is lowered by reducing a number of dangling bonds through hydrogenation or reducing a localized state in a bandgap.

An optical bandgap of the hydrogenated amorphous silicon is about 1.8 electron-volts (eV), dark conductivity is about 3×10−10 siemens per centimeter (S/cm), and photoconductivity is about 1×10−4 (S/cm). That is, conductivity of the amorphous silicon by the light is changeable, which is caused by the fact that the amorphous silicon has a photo-conductive characteristic.

The ohmic contacts 167a and 167b are disposed on the third semiconductor 154c. The resistance inputting electrode 177a and the resistance outputting electrode 177b are disposed on the ohmic contacts 167a and 167b, respectively.

Referring to FIG. 4B, when a gate-on signal is applied to the first reference resistance electrode 125a and the second reference resistance electrode 125b, charges are concentrated on a bottom surface of the resistance inputting electrode 177a and the resistance outputting electrode 177b by a voltage applied to the first reference resistance electrode 125a.

However, since no electrode is provided between the resistance inputting electrode 177a and the resistance outputting electrode 177b, the charges concentrated on the bottom surface of the resistance inputting electrode 177a cannot be easily moved to the resistance outputting electrode 177b.

As described above, the voltage of the gate-on signal applied to the first reference resistance electrode 125a and the second reference resistance electrode 125b is greater than the data voltage applied to the data line 171.

As such, when the voltage of the gate-on signal applied to the first reference resistance electrode 125a and the second reference resistance electrode 125b is greater than the data voltage applied to the data line 171, an amount of charges accumulated to the resistance inputting electrode 177a increases, and such accumulated charges gradually move to the resistance outputting electrode 177b through the third semiconductor 154c, such that a voltage is transmitted to the second pixel electrode 191b.

However, since no electrode is provided at a lower portion of the third semiconductor 154c between the resistance inputting electrode 177a and the resistance outputting electrode 177b, the third semiconductor 154c is not a channel and the third semiconductor 154c between the resistance inputting electrode 177a and the resistance outputting electrode 177b is a resistor, such that a portion of the voltage applied to the resistance inputting electrode 177a is transmitted to the resistance outputting electrode 177b. Accordingly, when the voltage applied to the second drain electrode 175b is transmitted to the second pixel electrode 191b, the voltage applied to the second drain electrode 175b is less than the data voltage applied to the first drain electrode 175a.

Resistance of the third semiconductor 154c between the resistance inputting electrode 177a and the resistance outputting electrode 177b may be varied according to the gate-on signal. This will be described later with reference to FIG. 7.

Heretofore, although the resistance inputting electrode 177a and the resistance outputting electrode 177b that are extended from the gate line 121 to which the gate-on signal is applied has been described, the invention is not limited thereto, and the resistance inputting electrode 177a and the resistance outputting electrode 177b may be extended from an electrode to which a pulse signal is applied during one frame for displaying an image.

Thus, according to the LCD of the exemplary embodiment, in order to decrease the voltage applied to the second subpixel electrode 191b, since different voltages can be applied to the first subpixel electrode 191a and the second subpixel electrode 191b without adding a TFT or a contact hole by forming a resistor using the gate conductor, the semiconductor, and the data conductor without further forming a thin film transistor, side visibility may be close to front visibility and a decrease of an aperture ratio of the LCD may be prevented due to not adding the TFT or the contact hole.

The basic electrode 199 will now be described with reference to FIG. 5.

As shown in FIG. 5, in an exemplary embodiment, the overall shape of the basic electrode 199 is quadrangular, and the basic electrode 199 includes a cross-shaped stem that includes a horizontal stem 193 and a vertical stem 192 that is perpendicular to the horizontal stem 193. Further, the basic electrode 199 is divided into a first subarea Da, a second subarea Db, a third subarea Dc, and a fourth subarea Dd by the horizontal stem 193 and the vertical stem 192, and each subarea Da, Db, Dc, and Dd includes a plurality of first to fourth minute branches 194a, 194b, 194c, and 194d, respectively.

The first minute branches 194a obliquely extend from the horizontal stem 193 or the vertical stem 192 in an upper left direction, and the second minute branches 194b obliquely extend from the horizontal stem 193 or the vertical stem 192 in an upper right direction. Further, the third minute branches 194c obliquely extend from the horizontal stem 193 or the vertical stem 192 in a lower left direction, and the fourth minute branches 194d obliquely extend from the horizontal stem 193 or vertical stem 192 in a lower right direction.

In an exemplary embodiment, the first to fourth minute branches 194a, 194b, 194c, and 194d form an angle of about 45 degrees (°) or about 135° with the gate lines 121a and 121b or the horizontal stem 193, for example. Further, the minute branches 194a, 194b, 194c, and 194d of two neighboring subareas Da, Db, Dc, and Dd may be perpendicular to each other.

As described above, the first subpixel electrode 191a and the second subpixel electrode 191b are respectively connected to the first drain electrode 175a and the second drain electrode 175b through the first contact hole 185a and the second contact hole 185b, and receive a voltage from the first drain electrode 175a and the second drain electrode 175b. In this case, sides of the first to fourth minute branches 194a, 194b, 194c, and 194d distort an electric field to generate a horizontal component determining an inclination direction of the liquid crystal molecules 31. The horizontal component of the electric field is nearly horizontal to the sides of the first to fourth fine branches 194a, 194b, 194c, and 194d. Therefore, as shown in FIG. 5, the liquid crystal molecules 31 are inclined in a direction that is parallel to length directions of the minute branches 194a, 194b, 194c, and 194d. Since one basic electrode 199 includes the four subareas Da to Dd in which length directions of the minute branches 194a, 194b, 194c, and 194d are different from each other, there are about four directions in which the liquid crystal molecules 31 are inclined, and four domains where the alignment directions of the liquid crystal molecules 31 are different from each other are provided in the liquid crystal layer 3. As described above, when the inclination directions of the liquid crystal molecules are diversified, a reference viewing angle of the LCD is increased.

Next, a method of initially aligning the liquid crystal molecules 31 to have the pretilt will be described with reference to FIG. 6.

Figure 6:
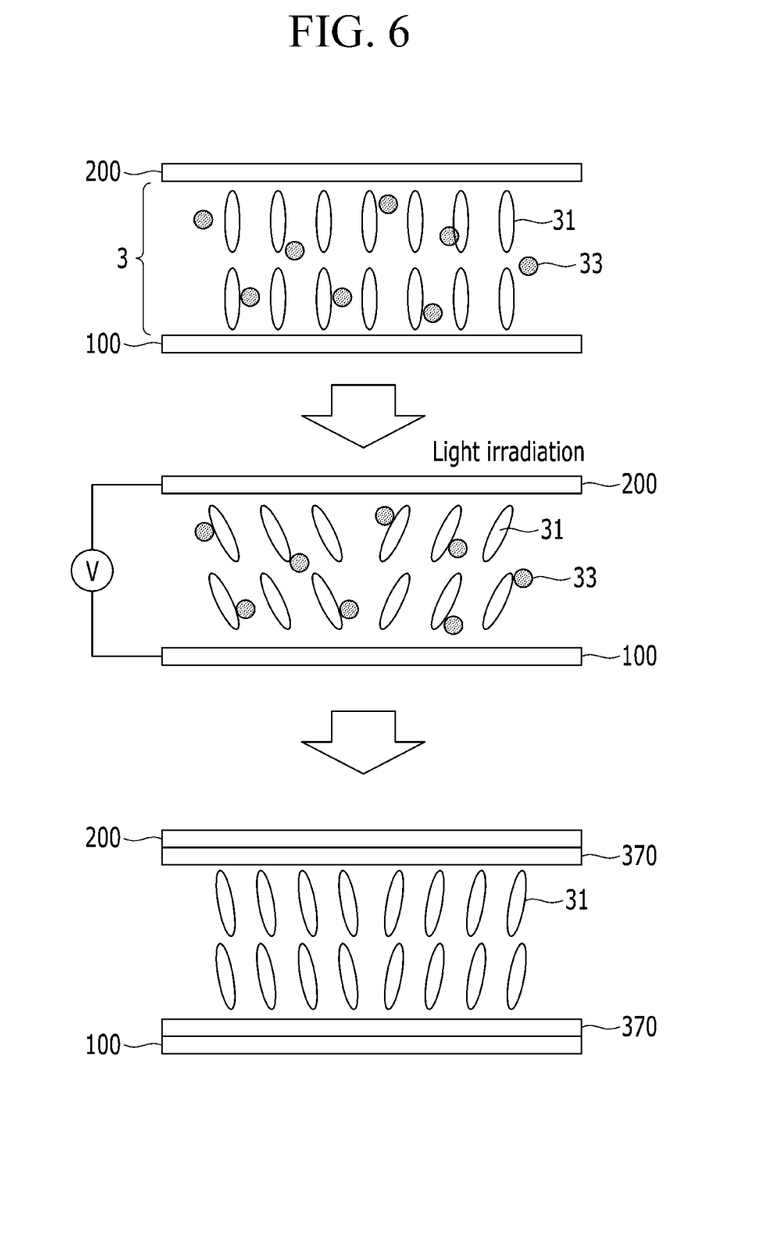
FIG. 6 illustrates a process for providing a pretilt to liquid crystal molecules using prepolymers that are polymerized by light such as ultraviolet rays.

FIG. 6 illustrates a process for providing a pretilt to liquid crystal molecules using prepolymers that are polymerized by light such as ultraviolet rays.

First, a prepolymer 33 such as a monomer that is polymerized by light such as ultraviolet rays is injected along with a liquid crystal material between the two display panels 100 and 200. In an exemplary embodiment, the prepolymer 33 may be a reactive mesogen that is polymerized by light such as ultraviolet rays.

Next, an electric field is generated in the liquid crystal layer 3 between the display panels 100 and 200 by applying a data voltage to the first subpixel electrode 191a and the second subpixel electrode 191b and applying a common voltage to the common electrode 270 of the second display panel 200. Thus, the liquid crystal molecules 31 of the liquid crystal layer 3 are inclined in the direction parallel to the length directions of the minute branches 194a, 194b, 194c, and 194d through the two steps as described above in response to the electric field and thus the liquid crystal molecules 31 in one pixel PX are inclined in a total of four directions.

When light such as ultraviolet rays is irradiated after an electric field is generated in the liquid crystal layer 3, the prepolymer 33 is polymerized to form a polymer 370, as shown in FIG. 6. The polymer 370 is provided to contact the display panels 100 and 200. The alignment directions of the liquid crystal molecules 31 are determined to have a pretilt corresponding to the aforementioned direction by the polymer 370. Accordingly, the liquid crystal molecules 31 are arranged to have pretilts corresponding to four different directions even in a state in which a voltage is not applied to the field generating electrodes 191 and 270.

Figure 7:
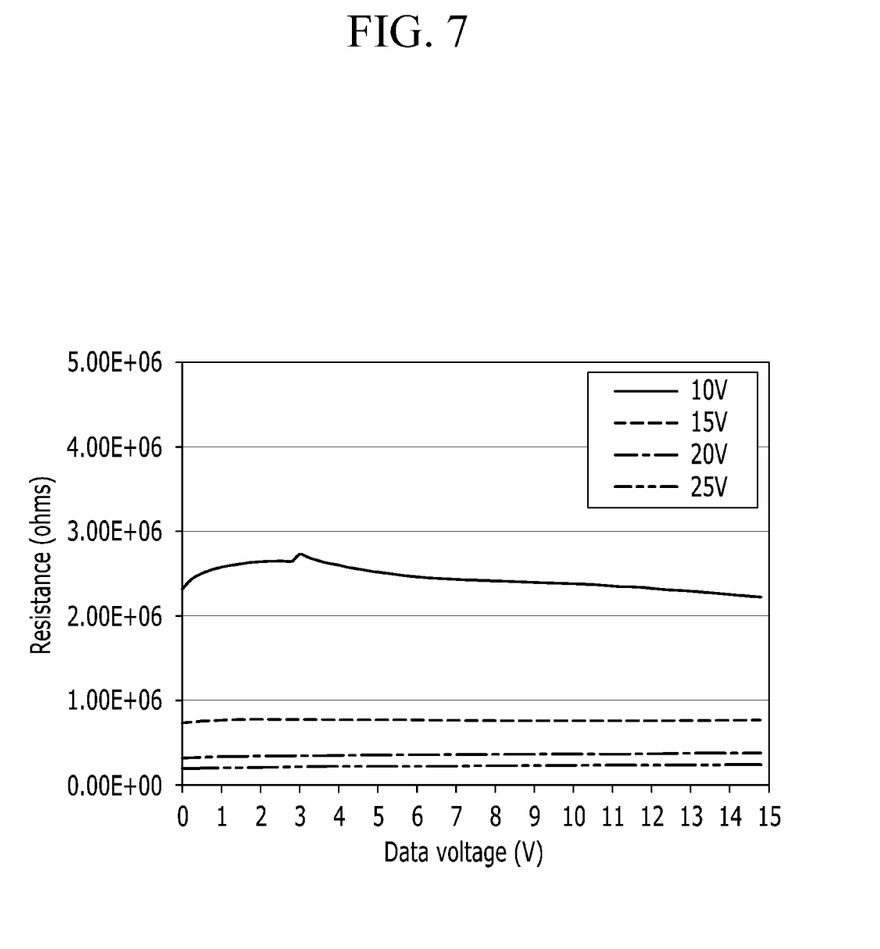
FIG. 7 is a graph illustrating results of an exemplary embodiment of an experimental example according to the invention.

Next, an experimental example according to an exemplary embodiment will be described with reference to FIG. 7. FIG. 7 is a graph illustrating results of an experimental example according to an exemplary embodiment.

In the experimental example, voltages of gate-on signals and resistance values of the resistor R according to voltages the data signals transmitted to the data line are measured with respect to a case in which the resistor R is disposed between the second drain electrode 175b and the second pixel electrode 191b, and the measured results are illustrated in FIG. 7.

As illustrated in FIG. 7, as the voltages of the gate-on signals increase, the resistance values of the resistor R decrease. When a voltage of the gate-on signal is about 15 V to about 25 V, that the resistance of the resistor R is substantially constant regardless of the voltage of the data signal may be identified.

As is known through the experimental example, resistance of the resistor R between the second drain electrode 175b and the second pixel electrode 191b may be adjusted by controlling the voltage of a pulsed gate-on signal. Therefore, the voltage of the data signal transmitted to the second subpixel electrode 191b varies depending on the resistance of the resistor R. Accordingly, the LCD according to the exemplary embodiments may adjust the voltage of the second subpixel electrode 191b by controlling the voltage of the gate-on signal. Further, since a period in which one pixel PX is applied with the gate-on signal is very short during one frame for displaying an image, deterioration of the resistor R between the second drain electrode 175b and the second pixel electrode 191b may be prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display comprising:
    a first substrate;
    a gate line which includes a reference resistance electrode directly disposed on the first substrate;
    a data line disposed on the first substrate;
    a first thin film transistor and a second thin film transistor connected to the gate line and the data line;
    a first subpixel electrode connected to the first thin film transistor;

a resistor connected to the second thin film transistor and comprising a resistance inputting electrode and a resistance outputting electrode separated from the resistance inputting electrode;

a second subpixel electrode connected to the resistor, and a resistance semiconductor layer disposed below the resistance inputting electrode and the resistance outputting electrode, wherein the reference resistance electrode overlaps the resistance inputting electrode and the resistance outputting electrode, and the reference resistance electrode is disposed below the resistance semiconductor layer.

2. The liquid crystal display of claim 1, wherein the resistance inputting electrode connected to an output terminal of the second thin film transistor; and the resistance outputting electrode connected to the second subpixel electrode.

3. The liquid crystal display of claim 1, wherein portions of edges of the resistance inputting electrode and the resistance outputting electrode overlap at least part of edges of the resistance semiconductor layer.

4. The liquid crystal display of claim 3, wherein the resistance inputting electrode and the resistance outputting electrode are spaced apart from each other.

5. The liquid crystal display of claim 1, wherein an edge of the reference resistance electrode and an edge of the resistance semiconductor layer overlap each other, and portions of edges of the resistance inputting electrode and the resistance outputting electrode overlap at least part of edges of the reference resistance electrode and the resistance semiconductor layer.

6. The liquid crystal display of claim 5, wherein reference resistance electrodes are divided to be disposed at a lower portion of the resistance semiconductor layer overlapping the resistance inputting electrode and to be disposed at a lower portion of the resistance semiconductor layer overlapping the resistance outputting electrode.

7. The liquid crystal display of claim 1, wherein the resistance semiconductor layer includes hydrogenated amorphous silicon.

8. The liquid crystal display of claim 1, wherein a voltage of the pulsed gate-on signal is greater than a data voltage applied to the data line.

9. The liquid crystal display of claim 8, wherein as the voltage of the pulsed gate-on signal increases, the resistance of the resistor decreases.

* * * * *